United States Patent
Huber et al.

(10) Patent No.: US 11,193,994 B2
(45) Date of Patent: Dec. 7, 2021

(54) SINGLE-STAGE AMPLIFIER WITH ACTIVE FEEDBACK COMPENSATION

(71) Applicant: Siemens Healthcare GmbH, Erlangen (DE)

(72) Inventors: Klaus Huber, Effeltrich (DE); Markus Vester, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/835,652

(22) Filed: Mar. 31, 2020

(65) Prior Publication Data

US 2020/0326395 A1    Oct. 15, 2020

(30) Foreign Application Priority Data

Apr. 10, 2019  (DE) .......................... 102019205114.6

(51) Int. Cl.
*G01R 33/36* (2006.01)
*G01R 33/3415* (2006.01)
*H03F 3/195* (2006.01)

(52) U.S. Cl.
CPC ..... *G01R 33/3614* (2013.01); *G01R 33/3415* (2013.01); *G01R 33/3607* (2013.01); *H03F 3/195* (2013.01); *H03F 2200/451* (2013.01)

(58) Field of Classification Search
CPC ........... G01R 33/3614; G01R 33/3415; G01R 33/3607; H03F 3/195; H03F 2200/451
See application file for complete search history.

(56) References Cited

U.S. PATENT DOCUMENTS

| | | | | |
|---|---|---|---|---|
| 3,969,682 A | * | 7/1976 | Rossum | H03H 11/20 330/85 |
| 5,469,058 A | * | 11/1995 | Dunnam | G01R 33/025 324/258 |
| 5,767,677 A | | 6/1998 | Anderson | |
| 5,886,580 A | * | 3/1999 | Ikeda | H03H 11/1217 330/293 |
| 6,424,226 B1 | * | 7/2002 | Thuis | H04B 1/0475 330/302 |

(Continued)

FOREIGN PATENT DOCUMENTS

| | | |
|---|---|---|
| DE | 69733451 T2 | 3/2006 |
| DE | 102009052197 A1 | 5/2011 |

(Continued)

OTHER PUBLICATIONS

German Office Action for German Application No. 10 2019 205114.6 dated Jan. 8, 2020.

*Primary Examiner* — G. M. A Hyder
(74) *Attorney, Agent, or Firm* — Lempia Summerfield Katz LLC

(57) ABSTRACT

A single-stage radio frequency amplifier is provided with a signal amplification stage for a magnetic resonance tomography scanner, for example as a low-noise preamplifier in a local coil. The radio frequency amplifier includes a signal input, a signal amplifier, a signal output of the signal amplifier and a phase shifter. The phase shifter is in signal connection with the signal output and the signal input of the signal amplifier and is configured to couple a predetermined portion of an output signal of the signal amplifier with a predetermined phase shift into the signal input of the signal amplifier.

12 Claims, 4 Drawing Sheets

(56) References Cited

U.S. PATENT DOCUMENTS

| | | | |
|---|---|---|---|
| 2005/0001680 A1* | 1/2005 | Ratzel | H03F 1/26 330/165 |
| 2008/0258731 A1* | 10/2008 | Smith | G01R 33/3621 324/322 |
| 2009/0102484 A1* | 4/2009 | DeVries | G01R 33/3415 324/322 |
| 2011/0109315 A1 | 5/2011 | Biber | |
| 2015/0002225 A1* | 1/2015 | Mattisson | H03F 1/342 330/293 |
| 2017/0016969 A1 | 1/2017 | Eberler | |
| 2019/0056467 A1 | 2/2019 | Oppelt | |
| 2019/0158032 A1* | 5/2019 | Takano | H03F 1/26 |

FOREIGN PATENT DOCUMENTS

| | | |
|---|---|---|
| DE | 102016204620 A1 | 1/2017 |
| DE | 102017214180 A1 | 2/2019 |

\* cited by examiner

SINGLE-STAGE AMPLIFIER WITH ACTIVE FEEDBACK COMPENSATION

CROSS REFERENCE TO RELATED APPLICATIONS

This patent application claims priority from German Application No. DE102019205114.6 filed on Apr. 10, 2019, which is hereby incorporated in its entirety.

FIELD

Embodiments relate to a preamplifier for antenna coils of a magnetic resonance tomography scanner.

BACKGROUND

Magnetic resonance tomography scanners are imaging devices that, to image an examination subject, align nuclear spins of the examination object by a strong external magnetic field and excite the nuclear spins by a magnetic alternating field for precession around the alignment. The precession or return of the spins from the excited state into a state with less energy in turn generates, as a response, a magnetic alternating field that is received by antennae.

With the aid of magnetic gradient fields, a spatial encoding is impressed onto the signals, that then permits an assignment of the received signal to a volume element. The received signal is evaluated, and a three-dimensional imaging representation of the examination object is provided.

The magnetic resonance signals to be received are extremely weak and close to the noise limit. A preamplification using low-noise preamplifiers, also referred to as LNA (low noise amplifiers), is therefore carried out directly on the antenna, for example that are configured as antenna coils. Aside from the low noise factor, a large dynamic range and a high linearity are also required on account of the signal that drops down exponentially in terms of time. This may be achieved by operation in the linear range of the characteristic curve (also referred to as class-A amplifier), that requires a relatively high closed current. At the same time, the amplification of an individual amplifier stage is limited by feedback tendency, e.g. on account of parasitic capacitances.

A cascode circuit consisting of 2 active semiconductor elements may be used in most cases to decouple the output from the input, that in turn, however, results in double the power consumption and corresponding heat generation that, particularly in an antenna matrix of a local coil directly on the patient, results in an unwanted heating.

BRIEF SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments provide an improved antenna preamplifier.

The single-stage radio frequency amplifier includes a signal input, a signal amplifier, and a signal output of the signal amplifier. An active component, that amplifies an amplitude of a signal present at the signal input and outputs at the signal output of the signal amplifier is considered to be a signal amplifier. The signal amplifier may be a voltage and/or current amplifier. For example, an amplification of the signal by more than 6 dB, 12 dB, 18 dB, 24 dB, 40 dB or more is considered to refer to an amplification. The radio frequency amplifier further includes a phase shifter. The phase shifter is in signal connection with the signal output and the signal input of the signal amplifier and is configured to couple a predetermined portion of an output signal of the signal amplifier with a predetermined phase shift into the signal input of the signal amplifier. The portion of the output signal may be smaller than the output signal, for example, the output signal is damped by more than 6 dB, 12 dB, 18 dB or 40 dB before it is injected into the signal input.

The single-stage radio frequency amplifier provides for stable operation by the phase shifter, despite high amplification in one stage and thus energy-saving operation with a low power loss by dispensing with a second amplifier stage.

The local coil includes a single-stage high-frequency amplifier and an antenna coil. Furthermore, the local coil includes a signal output, a mixer, or an analog-to-digital converter. Only one signal amplifier is arranged in the signal path between the antenna coil and the signal output, the mixer or analog-to-digital converter. For example, the pre-amplification of the signal of the antenna coil is only carried out by the one signal amplifier before the signal is digitized by the analog-to-digital converter or routed by way of a signal output, possibly following a frequency conversion by the mixer, via a signal line or wirelessly to a magnetic resonance tomography scanner. There may be passive or active components in the signal path that are used for filtration or adaptation purposes. For example, an amplification of the signal by more than 6 dB, 12 dB, 18 dB, 24 dB, 40 dB or more is considered here to be a preamplification.

The single-stage radio frequency amplifier and the local coil provided therewith provide a stable and high preamplification of the antenna signal directly on the signal source, without in the process increasing the power loss due to a number of active signal amplification stages to cause unwanted waste heat on the patient.

In an embodiment of the radio frequency amplifier, the phase shifter includes an amplifier element. Bipolar transistors, for example, are amplifier elements, but other active components may also be used that are configured to amplify a signal and, for example, to decouple the signal input of a feedback from the signal output, for example field effect transistors. The phase shifter is configured to couple a signal into the signal input of the signal amplifier as a function of the inverted signal. In an embodiment, the phase shifter includes a circuit using the amplifier element, that inverts the input signal and therefrom using passive components injects the same into the signal input of the signal amplifier. The amplifier element does not necessarily act as an amplifier in the narrower sense, in which the absolute values of the signal increase between the signal input of the phase shifter and signal output. It is much more important that a feedback from the signal output of the phase shifter to the signal input of the phase shifter is considerably reduced or suppressed, for example by 6 dB, 12 dB, 18 dB or 40 dB.

An inverter with an amplifier element in the phase shifter provides an unwanted feedback of the output onto the input and, in the case of low amplification, may still be provided with a low power consumption.

In an embodiment of the radio frequency amplifier, one or more passive elements with a complex resistance are arranged between the amplifier element and the input. The one or more passive elements may be resistances, capacitances or inductances or combinations thereof, for instance, that are configured to provide an additional predetermined phase shift of the signal coupled into the signal input of the signal amplifier.

The complex resistance provides a flexible variation of the phase shift beyond the 180 degrees of the inverter.

In an embodiment, the signal amplifier of the radio frequency amplifier includes a field effect transistor.

A field effect transistor provides a radio frequency signal amplification with a lower power requirement and lower noise compared with a bipolar transistor.

In an embodiment of the radio frequency amplifier, the amplifier element is a bipolar transistor in the emitter circuit.

A bipolar transistor in the emitter circuit provides an inverter in a cost-effective and energy-saving manner, with which the output signal may be displaced by 180 degrees in the phase.

The above-described properties, features and advantages of this invention and the manner in which they are achieved are made more clearly and distinctly intelligible in conjunction with the following description of the exemplary embodiments that are described in greater detail making reference to the drawings.

DETAILED DESCRIPTION

Figure 1:
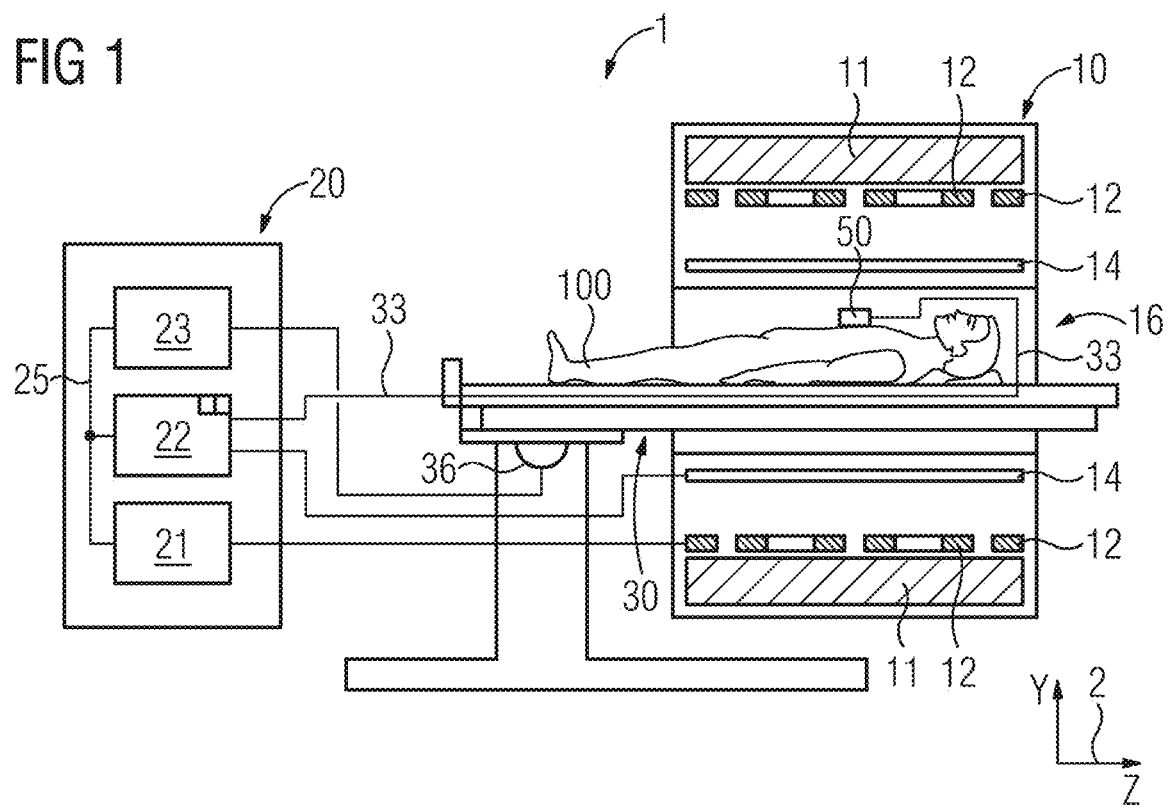
FIG. 1 depicts a schematic overview representation of a magnetic resonance tomography scanner with a local coil according to an embodiment.

FIG. 1 depicts a schematic representation of an embodiment of a magnetic resonance tomography scanner 1 including a local coil 50.

The magnet unit 10 includes a field magnet 11, that produces a static magnetic field BO for aligning nuclear spins of test specimens or of the patient 100 in a recording region. The recording region is characterized by an extremely homogeneous static magnetic field BO. The homogeneity relates, for example, to the magnetic field strength or the amount. The recording region is virtually spherical in shape and is arranged in a patient tunnel 16 that extends in a longitudinal direction 2 through the magnet unit 10. A patient couch 30 is movable in the patient tunnel 16 by the positioning unit 36. The field magnet 11 may be a superconducting magnet that may provide magnetic fields including a magnetic flux density of up to 3T or higher. For lower field strengths, however, permanent magnets or electromagnets including normal-conducting coils may also be used.

The magnet unit 10 further includes gradient coils 12 that are configured for spatial differentiation of the acquired imaging regions in the examination volume to overlay variable magnetic fields onto the magnetic field BO in three spatial directions. The gradient coils 12 may be coils made of normally conducting wires that may generate mutually orthogonal fields in the examination volume.

The magnet unit 10 also includes a body coil 14 that is configured to radiate into the examination volume a radio frequency signal supplied via a signal line, to receive resonance signals emitted by the patient 100, and to output said resonance signals via a signal line.

A control unit 20 supplies the magnet unit 10 with the various signals for the gradient coils 12 and the body coil 14 and evaluates the signals received.

The control unit 20 includes a gradient control 21 that is configured to provide the gradient coils 12 with variable currents by way of supply lines. The variable currents provide the desired gradient fields in the examination volume on a temporally coordinated basis.

The control unit 20 further includes a radio frequency unit 22 that is configured to generate a radio frequency pulse with a predetermined temporal sequence, amplitude and spectral power distribution for excitation of a magnetic resonance of the nuclear spins in the patient 100. Thereby, pulse power levels in the region of kilowatts may be achieved. The excitation pulses may be radiated into the patient 100 via the body coil 14 or also via a local transmitting antenna.

A controller 23 communicates with the gradient controller 21 and the radio frequency unit 22 via a signal bus 25.

Magnetic resonance signals of the excited nuclear spins from the patient 100 may be received by a local coil 50 that is arranged directly on the patient 100 to achieve as good a signal-to-noise ratio as possible.

Figure 2:
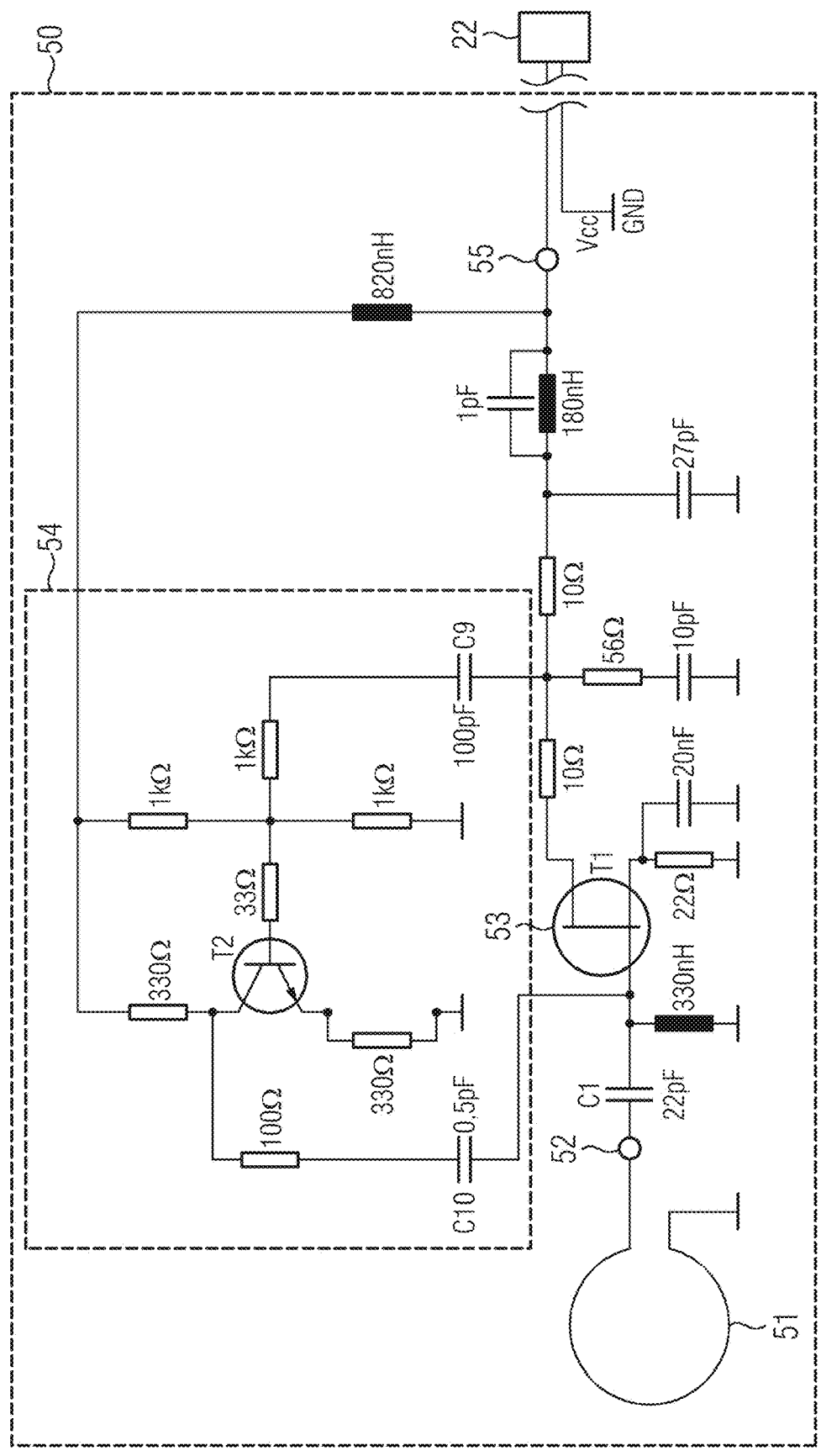
FIG. 2 depicts a schematic representation of a circuit of the single-stage radio frequency amplifier according to an embodiment.

FIG. 2 depicts a schematic representation of a circuit of the single-stage radio frequency amplifier in a local coil 50.

The local coil 50 includes an antenna coil 51 with which a magnetic resonance signal is received from the body of the patient 100. The magnetic resonance signal is present at the signal input 52 and is injected into a signal amplifier 53, for example the field effect transistor T1, by way of a capacitor C1. The injection is depicted simplified. An adaptation network for adapting impedance and symmetry of the input signal and protective diodes for limiting the input signal may also be used, for example.

The signal amplifier 53 is operated in the source circuit. The amplified signal is then present at the signal output 55 for transmission to the radio frequency unit 22 of the magnetic resonance tomography scanner 1. The connecting line to the radio frequency unit 22 is used at the same time for the voltage supply.

Like all transistors and field effect transistors, T1 includes parasitic capacitances between gate and drain, that according to what is known as the Miller effect, takes effect to a greater degree on the basis or the gate on account of the amplification in the source circuit. Aside from the larger capacitive load of the signal input 52, feedback effects and vibrations associated therewith may occur on account of the phase shift with increased amplification.

In currently used systems, the voltage amplification of the first transistor is therefore reduced by a low-impedance load of its output and the high overall amplification is divided out between antenna coil 51 and signal output 55 (known as cascode circuit) by cascading two transistors as two amplifier stages in the signal amplifier. In this process the power loss doubles, however, since both transistors have to be operated with correspondingly high closed currents as class-A amplifiers in the linear region of the characteristic curve, for example, with the typically required output impedance of 50 Ohm on the transmission line.

The single-stage radio frequency amplifier takes a different route. The effect of the parasitic capacitance is compensated by a phase shifter 54, that injects one part of the output signal of the signal amplifier with a predetermined phase shift into the signal input 51. With a suitable phasing, the effect of the parasitic capacitance and of the signal of the phase shifter 54 increase further.

The phase shifter 54 in FIG. 2 includes an amplifier element in the form of the transistor T2, for example a bipolar transistor. The transistor T2 is connected in the emitter circuit and obtains a small part of the output signal of the signal amplifier 53 injected by the capacitance C9. On account of the base voltage divider, only a small current flows, approximately smaller by the factor 10 compared with the signal amplifier 53 through the transistor T2. On account of the low amplitude of the injected signal and thus also of the output signal at the collector, the non-linearity at this working point of the transistor T2 is still negligible.

The advantage of the circuit in FIG. 2 is, for example, that the amplifier element in the form of the transistor T2 effects a well-defined phase shift of 180 degrees, that is largely independent of external influences such as the antenna coils 51 and the antenna coils 51 couplings for instance to adjacent antenna coils in an antenna matrix. The input of the transistor is also significantly decoupled from the output. Since a relatively small signal current has to be generated to compensate for the parasitic capacitance, the transistor T2 in the phase shifter may be operated with significantly lower power compared with a second amplifier stage in a cascode, since the linearity and the dynamic range are not required such as for the magnetic resonance signal itself.

Figure 3:
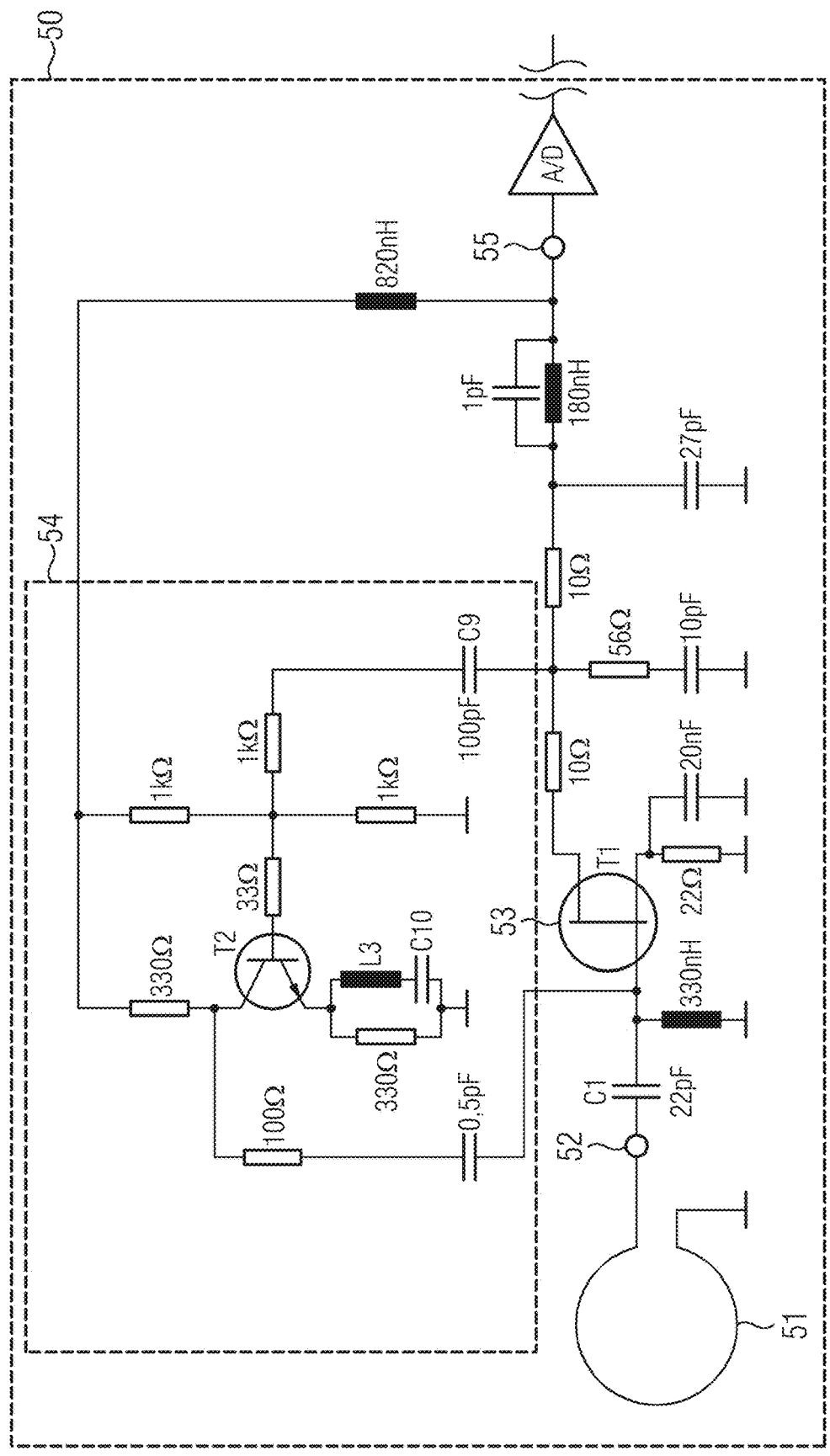
FIG. 3 depicts a schematic representation of a circuit of the single-stage radio frequency amplifier according to an embodiment.

FIG. 3 depicts a further embodiment of a local coil 50 with a single-stage radio frequency amplifier. The basic structure corresponds to that in FIG. 2, but in the emitter branch of the phase shifter 54 additional passive components are arranged with a complex reactance, like the coil L3 and the capacitance C10, that, together with the resistance, establish a further additional phase shift in addition to the 180 degrees by the transistor T2. The phase shift may be set more precisely by suitably selecting the component and the compensation of the parasitic capacitance may thus be improved, thereby resulting in increased stability.

The phase shifter 54 may only have a network of passive components with a complex resistance that results in a further reduction in the power loss. At the same time, the stability drops during operation, however, since the passive network, contrary to the transistor T2, is not able to provide the desired 180 phase relationship across the entire bandwidth of the amplifier.

Instead of the signal line from the local coil 50 directly to the radio frequency unit 22 depicted in the preceding figures, the signal may be subjected to further processing steps prior to the transmission. This may be a filtering or an adaptation to the signal line through a passive network, for example. The signal may be implemented analogously on another frequency or similarly depicted in the local coil 50 as in FIG. 3 digitized by an analog-to-digital converter. The analogue signal preamplification takes place before the processing steps by the single-stage radio frequency amplifier and as a result for the power requirement and the waste heat to be able to be reduced significantly.

Figure 4:
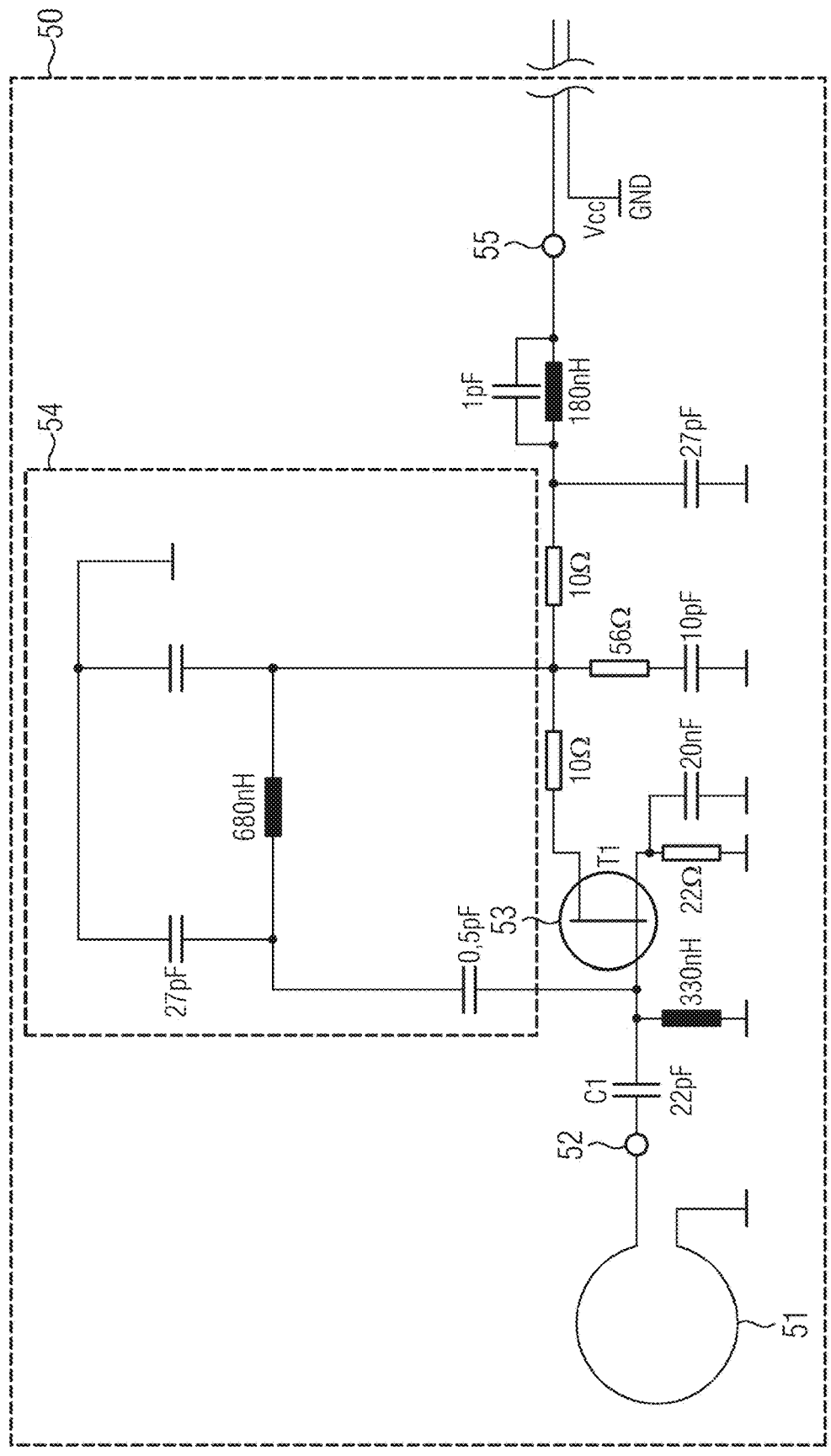
FIG. 4 depicts a schematic representation of a circuit of the single-stage radio frequency amplifier according to an embodiment.

FIG. 4 depicts a further embodiment of a local coil 50 with a single-stage radio frequency amplifier. The phase shifter 54 is not configured with a transistor T2, but the phase shift is instead realized solely by a network with a complex resistance, in the example shown the coil and the two capacitors. The lower power consumption nevertheless negatively affects the stability, thereby rendering the circuit unsuited to a comparatively large frequency range such as the circuits in FIG. 2 and FIG. 3.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A single-stage radio frequency amplifier including a signal amplification stage for a magnetic resonance tomography scanner wherein the single-stage radio frequency amplifier comprises:
   a signal input;
   a signal amplifier including a signal output; and
   a phase shifter configured to be in signal connection with the signal output and the signal input of the signal amplifier, the phase shifter comprising an amplifier element that is configured to generate an inverted signal from an output signal of the signal amplifier wherein the phase shifter is further configured to couple a signal into the signal input of the signal amplifier as a function of the inverted signal and to couple a predetermined portion of the output signal of the signal amplifier with a predetermined phase shift into the signal input of the signal amplifier.

2. The single-stage radio frequency amplifier of claim 1, wherein the single-stage radio frequency amplifier is configured as a low-noise preamplifier in a local coil of the magnetic resonance tomography scanner.

3. The single-stage radio frequency amplifier of claim 1, wherein one or more passive elements with a complex resistance are arranged between the amplifier element and the signal input and are configured to provide an additional predetermined phase shift of the signal coupled into the signal input of the signal amplifier.

4. The single-stage radio frequency amplifier of claim 1, wherein the signal amplifier includes a field effect transistor.

5. The single-stage radio frequency amplifier of claim 1, wherein the phase shifter is coupled with an emitter circuit including at least a bipolar transistor.

6. The single-stage radio frequency amplifier of claim 5, wherein a collector resistance, an emitter resistance, or the collector resistance and the emitter resistance is configured on the bipolar transistor so that a power loss at the bipolar transistor is significantly smaller than a power loss at the signal amplifier.

7. A local coil comprising:
   an antenna coil and a signal output;
   a single-stage radio frequency amplifier comprising:
      a signal input;
      a signal amplifier including the signal output; and
      a phase shifter configured to be in signal connection with the signal output and the signal input of the signal amplifier and is configured to couple a predetermined portion of an output signal of the signal amplifier with a predetermined phase shift into the signal input of the signal amplifier; and
   a mixer or an analog-to-digital converter, wherein only one signal amplifier is arranged in a signal path between the antenna coil and the signal output, the mixer, or the analog-to-digital converter.

8. The local coil of claim 7, wherein the phase shifter comprises an amplifier element that is configured to generate an inverted signal from the output signal of the signal amplifier and wherein the phase shifter is configured to couple a signal into the signal input of the signal amplifier as a function of the inverted signal.

9. The local coil of claim 8, wherein one or more passive elements with a complex resistance are arranged between the amplifier element and the signal input and are configured to provide an additional predetermined phase shift of the signal coupled into the signal input of the signal amplifier.

10. The local coil of claim 7, wherein the signal amplifier includes a field effect transistor.

11. The local coil of claim 7, wherein the phase shifter is a bipolar transistor in an emitter circuit.

12. The local coil of claim 11, wherein a collector resistance, an emitter resistance, or the collector resistance and the emitter resistance is configured on the bipolar transistor so that a power loss at the bipolar transistor is significantly smaller than a power loss at the signal amplifier.

* * * * *